United States Patent [19]

Rickerby

[11] Patent Number: 5,652,044
[45] Date of Patent: Jul. 29, 1997

[54] COATED ARTICLE

[75] Inventor: David Rickerby, Derby, England

[73] Assignee: Rolls Royce plc, London, England

[21] Appl. No.: 295,712

[22] PCT Filed: Mar. 3, 1993

[86] PCT No.: PCT/GB93/00441

§ 371 Date: Dec. 14, 1994

§ 102(e) Date: Dec. 14, 1994

[87] PCT Pub. No.: WO93/18199

PCT Pub. Date: Sep. 16, 1993

[30] Foreign Application Priority Data

Mar. 5, 1992 [GB] United Kingdom .................. 9204791

[51] Int. Cl.$^6$ .......................... B32B 15/04; B32B 18/00
[52] U.S. Cl. ................... 428/216; 428/212; 428/215; 428/217; 428/220; 428/469; 428/472; 428/699; 428/701; 428/615; 428/621; 428/622; 428/623; 428/632; 428/633; 428/635; 427/248.1; 427/250; 427/255.7; 427/535
[58] Field of Search .......................... 428/688, 689, 428/699, 701, 702, 469, 472, 615, 621, 632, 633, 635, 622, 623, 212, 213, 216, 217, 220; 427/248.1, 250, 255, 255.7, 535

[56] References Cited

U.S. PATENT DOCUMENTS

| 3,677,789 | 7/1972 | Bungardt et al. | 117/22 |
| 3,692,554 | 9/1972 | Bungardt et al. | 117/22 |
| 3,819,338 | 6/1974 | Bungardt et al. | 29/194 |
| 3,961,910 | 6/1976 | Baladjanian et al. | 29/197 |

(List continued on next page.)

FOREIGN PATENT DOCUMENTS

| 57-140876 | 8/1982 | Japan . |
| 6-306640 | 11/1994 | Japan . |
| 1 318 609 | 5/1973 | United Kingdom . |
| 2046369 | 12/1980 | United Kingdom . |
| 2117269 | 12/1983 | United Kingdom . |
| 92/05298 | 4/1992 | WIPO . |
| 94/15000 | 7/1994 | WIPO . |

OTHER PUBLICATIONS

R. Lowrie, "Composite Coatings of CoCrAlY Plus Platinum", *Thin Solid Films*, 45 (1977), pp. 491–498.

Birks et al., "Introduction to High Temperature Oxidation of Metals", 1983, p. 128.

A. McMinn et al., "Field Evaluation of Gas Turbine Protective Coatings", *Journal of Engineering for Gas Turbines and Power*, vol. 110, Jan. 1988, p. 142.

Surface and Coatings Technology vol. 32, 23 Mar. 1987, Lausanne CH pp. 389–397 J. T. Prater et al 'Ceramic Thermal Barrier Coatings with Improved Corrosion Resistance' cited in the application see p. 391, line 12–31.

Thin Solid Films vol. 127 No. 1/2, May 1985, Lausanne CH pp. 93–105 T.E. Strangman 'Thermal Barrier Coatings for Turbine Airfoils', see p. 100, line 29, p. 101, line 3 (All References Will Follow).

*Primary Examiner*—Ellis Robinson
*Attorney, Agent, or Firm*—Oliff & Berridge

[57] ABSTRACT

A superalloy turbine blade (10) has a MCrAlY bond coating (22) and a thermal barrier coating (24). The thermal barrier coating (24) comprises a plurality of alternate layers (25, 27) which have different structure to produce a plurality of interfaces (26) substantially parallel to the metallic substrate (20)/bond coating (22) interface. These interfaces (26) provide paths of increased resistance to heat transfer to reduce the thermal conductivity of the thermal barrier coating (24). The structure in the alternate layers (25, 27) of the thermal barrier coating (24) is columnar (28), or segmented, to ensure that the strain tolerance of the thermal barrier coating (24) is not impaired. The columnar grains (28) in the layers (25, 27) extend substantially perpendicular to the metallic substrate (20)/bond coating (22) interface. This enables thermal barrier coatings (24) of reduced thickness and weight to be used. The bond coating may have an oxide or oxide/metal interface which improves the adhesion of the thermal barrier coating.

40 Claims, 8 Drawing Sheets

U.S. PATENT DOCUMENTS

| | | | |
|---|---|---|---|
| 3,979,273 | 9/1976 | Panzera et al. | 204/192 |
| 3,999,956 | 12/1976 | Stueber et al. | 29/194 |
| 4,123,595 | 10/1978 | Chang | 428/667 |
| 4,137,370 | 1/1979 | Fujishiro et al. | 428/660 |
| 4,321,310 | 3/1982 | Ulion et al. | 428/612 |
| 4,321,311 | 3/1982 | Strangman | 428/623 |
| 4,399,199 | 8/1983 | McGill et al. | 428/633 |
| 4,401,697 | 8/1983 | Strangman | 427/250 |
| 4,405,659 | 9/1983 | Strangman | 427/428.1 |
| 4,477,538 | 10/1984 | Clarke | 428/656 |
| 4,530,885 | 7/1985 | Restall | 428/670 |
| 4,643,951 | 2/1987 | Keem | 428/469 |
| 4,722,869 | 2/1988 | Honda et al. | 428/611 |
| 4,880,614 | 11/1989 | Strangman | 428/623 |
| 4,916,022 | 4/1990 | Solfest et al. | 428/623 |
| 5,015,502 | 5/1991 | Strangman et al. | 427/248.1 |
| 5,180,285 | 1/1993 | Lau | 416/241 |
| 5,236,745 | 8/1993 | Gupta et al. | 427/454 |
| 5,238,752 | 8/1993 | Duderstadt et al. | 428/623 |
| 5,427,866 | 6/1995 | Nagaraj et al. | 428/610 |
| 5,514,482 | 5/1996 | Strangman | 428/623 |

COATED ARTICLE

FIELD OF THE INVENTION

The present invention is concerned with coatings for metallic substrates, and is particularly concerned with ceramic thermal barrier coatings for metallic components for use in gas turbine engines.

BACKGROUND OF THE INVENTION

It is known in the prior art to apply ceramic to a metallic substrate to produce a ceramic thermal barrier coating by the thermal, or plasma, spray process. In this technique the ceramic is applied onto a bond coat, for example a MCrAlY bond coat, which has been applied to the metallic substrate.

It is also known in the prior art to apply ceramic to a metallic substrate to produce a ceramic thermal barrier coating by the physical vapour deposition (PVD) process. In this technique the ceramic is applied onto a bond coat, for example a MCrAlY coating with an alumina interface layer, which has been applied to the metallic substrate. The ceramic thermal barrier coatings deposited by the PVD process have benefits over the ceramic thermal barrier coatings deposited by a thermal spray process. The main benefit is improved thermal shock resistance due to the columnar structure of the ceramic thermal barrier coating produced by the PVD process. Other benefits are improved erosion resistance and improved aerothermal performance.

However, despite these advantages, the ceramic thermal barrier coating deposited by the PVD process exhibits a thermal conductivity which is greater than that of a ceramic thermal barrier coating, of the same or similar composition, deposited by the thermal spray process. For example the thermal conductivity of a zirconia-8% yttria ceramic thermal barrier coating deposited by the PVD process is 2.0 W/m/K and the thermal conductivity for the same ceramic thermal barrier coating deposited by the thermal spray process is 0.8–1.0 W/m/K. If all other factors are the same for the two methods of deposition of the ceramic thermal barrier coating, the greater thermal conductivity of the ceramic thermal barrier coating deposited by the PVD process means that a greater thickness of ceramic is required to achieve the equivalent insulating effect when compared to the ceramic thermal barrier coating deposited by the thermal spray process. This is an undesirable property because this necessitates a greater weight of ceramic thermal barrier coating on the metallic components of the gas turbine engine, and this is particularly undesirable for rotating components e.g. turbine blades because the additional weight may limit the temperature of operation due to a corresponding reduction in the creep life of the metallic turbine blade.

A paper entitled "Microlaminate Composites as Thermal Barrier Coatings" by M. C.Radhakrishna, H. J. Doerr, C. V. Deshpandey and R. F. Bunshah was presented at the 15th International Conference on Metallurgical Coatings, at San Diego, USA, 11–15th Apr. 1988 and was subsequently presented in Surface and Coatings Technology, 36 (1988) 143–150. The paper discloses the use of microlaminate composites to reduce the thermal conductivity of physical vapour deposited thermal barrier coatings. The microlaminate composites comprise alternate layers of two different materials, e.g. two different metals, two different ceramics or a metal and a ceramic. The paper specifically describes the use of nickel layers interposed between layers of NiCoCrAlY and titanium layers interposed between layers of CoCrAlY. These microlaminates have thermal conductivities of 7.48 W/m/K for a 480 layer Ni/NiCoCrAlY coating system and 6.76 W/m/K for a 480 layer Ti/CoCrAlY coating system. The paper then suggests that the thermal conductivity of the microlaminate composite may be tailored to obtain thermal conductivity values similar to those of yttrium stabilised zirconia deposited by the thermal spray process by choosing appropriate metal and ceramic microlaminates.

A paper entitled "Sputter-Deposited Multilayered Ceramic/Metal Coatings" by J. W. Patten, M. A. Bayne, D. D. Hayes, R. W. Moss and E. D. McClanahan was presented at the International Conference on Metallurgical Coatings, San Diego, USA, 23–27th Apr. 1979 and was subsequently presented in Thin Solid Films, 64 (1979) 337–343. The paper discloses the use of alternate layers of metal and ceramic. The ceramic layers are to provide erosion, corrosion and possibly thermal insulation, while the metal layers improve mechanical properties. The metal and ceramic layers are sputter deposited. The alternate layers described were nickel interposed between yttria stabilised zirconia and nickel-chromium interposed between yttria stabilised zirconia. The ceramic layers are of the columnar type.

A further disclosure in published European patent application 0366289A entitled "Multi-Layer Wear Resistant Coatings" uses alternate layers of metallic and ceramic materials to provide an erosion and corrosion resistant coating. This discloses layers of titanium and titanium nitride but metal layers of boron, zirconium, hafnium, tantalum or iron may be used and ceramic layers of a nitride, a carbide or an oxide of these metals may be used. The coatings may be applied by sputtering, physical vapour deposition or chemical vapour deposition.

We believe that the concept of inserting metallic layers between layers of ceramic to provide improved performance with regard to the thermal conduction, i.e. to reduce the thermal conductivity and coating ductility of a thermal barrier coating is unsound for the following reasons. It is not thought likely that such an approach will lead to a reduction in the thermal conductivity of the thermal barrier coating and the metal layers will become oxidised leading to instability of the thermal barrier coating.

Furthermore, the use of layers of different materials in a thermal barrier coating necessitates the use of separate sources of metal and ceramic which have to be evaporated, or sputtered, to deposit the alternate layers on the metallic substrate. Alternatively reactive gas sources have to be available to provide reactive gas to react with the evaporated metal to produce the ceramic layers.

A paper entitled "Ceramic Thermal Barrier Coatings with Improved Corrosion Resistance" by J. T. Prater and E. L. Courtright was presented at the 14th International Conference on Metallurgical Coatings, San Diego, USA, 23–27th Mar. 1987 and was subsequently presented in Surface and Coatings Technology, 32 (1987) 389–397. The paper discloses a method for limiting the ingress of corrosive species in physical vapour deposited yttria stabilised zirconia ceramic thermal barrier coatings by inserting dense ceramic sealing layers between the usual columnar ceramic layers. The dense ceramic sealing layers disrupt the columnar ceramic layers to reduce the permeability to liquid and gaseous species and increases the corrosion resistance of the ceramic thermal barrier coating.

The columnar layers were deposited by sputtering and the dense ceramic sealing layers were deposited by sputtering and applying a RF induced DC bias on the substrate. The voltage applied during the period that the bias is applied to the substrate causes renucleation/grain growth within the coating structure and destroys the major, through thickness, columnar boundaries between columnar grains.

However, this paper does not disclose any details of the effect of the dense ceramic sealing layers on the thermal conductivity of the ceramic thermal barrier coating.

SUMMARY OF THE INVENTION

The present invention seeks to provide an article which comprises a metallic substrate having a columnar thermal barrier coating in which the thermal barrier coating has reduced thermal conductivity.

Accordingly the present invention provides an article comprising a metallic substrate, a bond coating on the metallic substrate, a thermal barrier coating on the bond coating, the thermal barrier coating comprising a plurality of layers, each layer having columnar grains, the columnar grains in each layer extending substantially perpendicular to the interface between the bond coating and the metallic substrate, adjacent layers having different structures to provide at least one interface between adjacent layers which is substantially parallel to the interface between the bond coating and the metallic substrate to increase the resistance to heat transfer through the thermal barrier coating.

The metallic substrate may be a superalloy substrate. The superalloy substrate may be a nickel superalloy substrate.

The bond coating may comprise a MCrAlY coating, an aluminide coating, platinum aluminide coating or a combination of any two or more thereof. For example a MCrAlY coating may be provided with an aluminide coating to provide more aluminium content to bond the thermal barrier coating onto the substrate. The bond coating may include an interface layer comprising an oxide or oxide/metal, the thermal barrier coating being on the interface layer.

The thermal barrier coating may be formed from a ceramic material. The ceramic material may comprise zirconia, yttria or a mixture thereof.

Alternate layers of the thermal barrier coating may have substantially the same structure.

Adjacent layers may have substantially the same thickness. The thickness of each layer may be in the range of $0.5 \times 10^{-6}$ m to $10 \times 10^{-6}$ m. Preferably the thickness of each layer is $2 \times 10^{-6}$ m. The total thickness of the thermal barrier coating may be up to $300 \times 10^{-6}$ m.

The layer adjacent to the bond coating may have a high density, preferably the layer adjacent the bond coating has maximum density.

The article may be a turbine blade or turbine vane.

The present invention also seeks to provide a method of manufacturing an article comprising applying a bond coating to a metallic substrate, applying a thermal barrier coating to the bond coating by depositing at least one columnar grained layer by vapour deposition and depositing at least one columnar grained layer by plasma assisted vapour deposition to provide an interface between the adjacent layers which is substantially parallel to the interface between the bond coating and the metallic substrate to increase the resistance to heat transfer through the thermal barrier coating.

Preferably depositing the columnar grained layers deposited by vapour deposition alternately with the columnar grained layers deposited by plasma assisted vapour deposition.

Preferably depositing the columnar grained layer adjacent the bond coating by plasma assisted vapour deposition such that it has a high density, preferably depositing the columnar grained layer adjacent to the bond coating such that it has maximum density.

Preferably applying an electrical bias to the metallic substrate and supplying oxygen to modify the bond coating surface to produce an interface layer comprising oxide or oxide/metal prior to deposition of the columnar grained layers by vapour deposition process.

Preferably applying an electrical bias to the metallic substrate and supplying an inert gas to produce ions to clean the surface of the bond coating prior to the formation of the interface layer.

Preferably depositing the columnar grained layers deposited by vapour deposition and the columnar grained layers deposited by plasma assisted vapour deposition such that they have substantially the same thickness.

Preferably the vapour deposition process is physical vapour deposition. The physical vapour deposition process may be electron beam evaporation, sputtering or arc evaporation.

Depositing the columnar grained layers to a thickness of $0.5 \times 10^{-6}$ m to $10 \times 10^{-6}$ m. Depositing the columnar grained layers to a total thickness up to $300 \times 10^{-6}$ m Preferably applying the bond coating by thermal spraying, the bond coating may comprise MCrAlY coating, an aluminide coating, platinum aluminide coating or a combination of any two or more thereof.

The metallic substrate may be a superalloy substrate. The thermal barrier coating may comprise a ceramic material. The ceramic material may be zirconia or yttria or a mixture thereof.

The present invention also provides an article comprising a metallic substrate, a bond coating on the metallic substrate, a thermal barrier coating on the bond coating, the thermal barrier coating having columnar grains, the columnar grains extending substantially perpendicular to an interface between the bond coating and the metallic substrate, each of the columnar grains in the thermal barrier coating comprising a plurality of layers, adjacent layers having different structures to provide at least one interface between adjacent layers which is substantially parallel to the interface between the bond coating and the metallic substrate to increase the resistance to heat transfer through the thermal barrier coating.

BRIEF DESCRIPTION OF THE DRAWINGS

The present invention will be more fully described by way of example, with reference to the accompanying drawings in which.

DETAILED DESCRIPTION OF THE INVENTION

Figure 1:
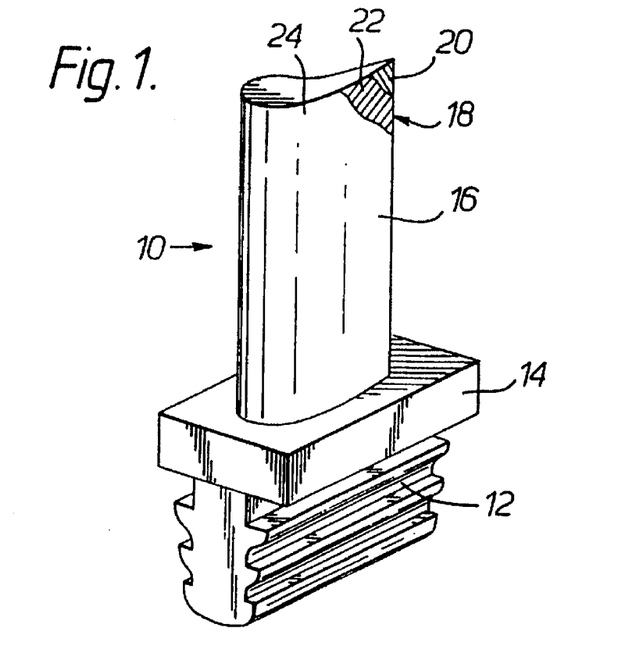
FIG. 1 is a perspective view of a gas turbine engine turbine blade according to the present invention.

A gas turbine engine turbine blade 10 is shown in FIG. 1. The turbine blade 10 comprises a shaped root portion 12, for attaching the turbine blade 10 to a turbine rotor, a platform portion 14, for defining a portion of the radially inner boundary of the gas flow path through the turbine, and an aerofoil portion 16, which extracts energy from the hot gases passing through the turbine. The platform portion 14, and the aerofoil portion 16, of the turbine blade 10 are provided with a coating system 18 which allows the turbine blade 10 to operate at higher gas temperatures.

The coating system 18 comprises a bond coating 22, deposited onto the metallic substrate 20 of the turbine blade 10, and a ceramic thermal barrier coating 24 deposited onto the bond coating 22.

Figure 2:
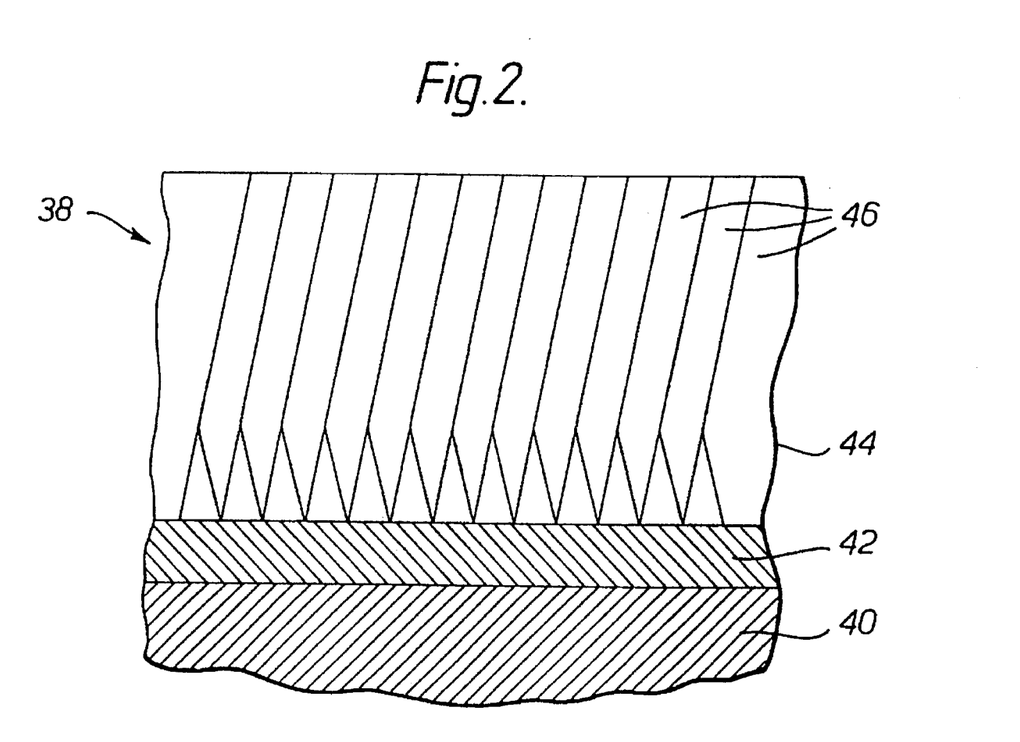
FIG. 2 is a sectional view through an article having a thermal barrier coating applied by a first prior art method.

A coating system 38 applied by a first prior art method is shown in FIG. 2. The coating system 38 comprises a bond coating 42, deposited onto the metallic substrate 40 and a ceramic thermal barrier coating 44 deposited onto the bond coating 42. The bond coating 42 is generally a MCrAlY coating which has been deposited by thermal spraying or by physical vapour deposition. (PVD), or the bond coating may be an aluminide coating. The bond coating 42 may additionally have an alumina layer. The ceramic thermal barrier coating 44 is generally zirconia or yttria or a mixture thereof which has been deposited onto the bond coating 42 by physical vapour deposition (PVD). The ceramic thermal barrier coating 44 has a columnar grained microstructure 46 which has a relatively high thermal conductivity, good strain tolerance, good surface finish and good erosion resistance.

Figure 3:
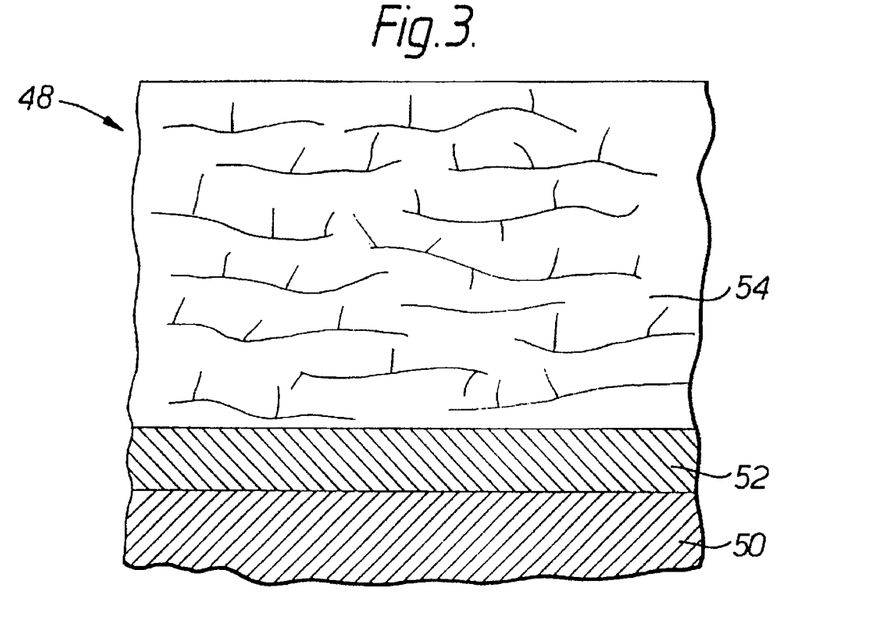
FIG. 3 is a sectional view through an article having a thermal barrier coating applied by a second prior art method.

A coating system 48 applied by a second prior art method is shown in FIG. 3. The coating system 48 comprises a bond coating 52, deposited onto the metallic substrate 50 and a ceramic thermal barrier coating 54 deposited onto the bond coating 52. The bond coating 52 is generally a MCrAlY coating which has been deposited by thermal spraying or by physical vapour deposition (PVD), or the bond coating may be an aluminide coating. The ceramic thermal barrier coating 54 is generally zirconia or yttria or a mixture thereof which has been deposited onto the bond coating 52 by thermal spraying. The ceramic thermal barrier coating 54 has a "brick wall" microstructure which has poor erosion resistance but has a relatively low thermal conductivity when compared to the thermal conductivity of the ceramic thermal barrier coating applied by the first prior art method mentioned above.

Figure 4:
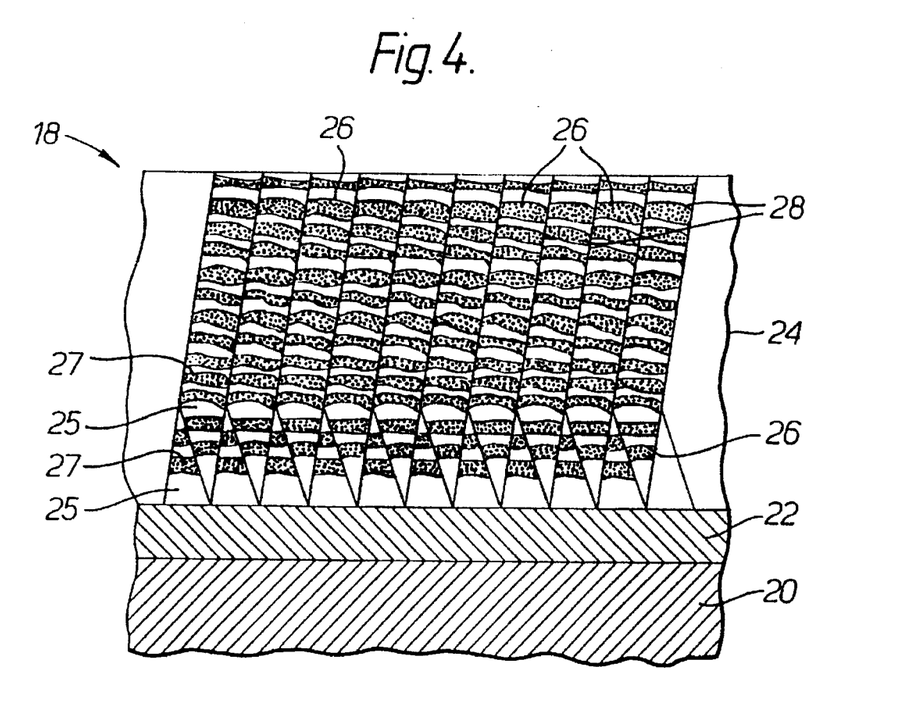
FIG. 4 is a sectional view through an article having a thermal barrier coating applied according to the present invention.
Figure 5:
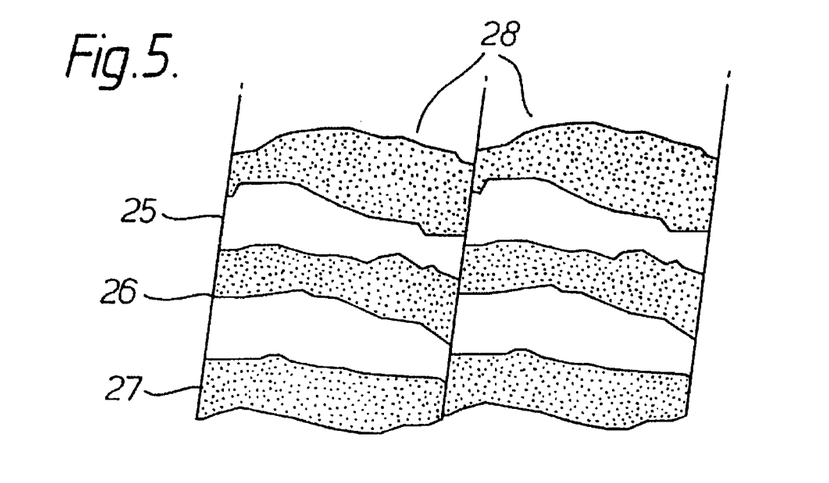
FIG. 5 is an enlarged view of a portion of the thermal barrier coating shown in FIG. 4.

The coating system 18 applied by the method of the present invention is shown more clearly in FIGS. 4 and 5.

The coating system 18 comprises a bond coating 22, deposited onto the metallic substrate 20 and a ceramic thermal barrier coating 24 deposited onto the bond coating 22.

The bond coating 22 is generally a MCrAlY coating which has been deposited by thermal spraying or by physical vapour deposition (PVD). Alternatively the bond coating 22 may be an aluminide coating which has been deposited by pack aluminising or may be a platinum-aluminide coating which has been deposited by platinum aluminising.

The ceramic thermal barrier coating 24 is generally zirconia, yttria or a mixture thereof which has been deposited onto the bond coating 22 by physical vapour deposition (PVD). Alternatively the ceramic thermal barrier coating 24 may comprise any other suitable ceramic. The ceramic thermal barrier coating 24 has a columnar grained microstructure 28 which has good strain tolerance, good surface finish and good erosion resistance. The ceramic thermal barrier coating 24 has a relatively low thermal conductivity when compared to the ceramic thermal barrier coating 44 of the coating system 38 in FIG. 2 and is substantially the same or better than the thermal conductivity of the ceramic thermal barrier coating 54 of the coating system 48 in FIG. 2. The ceramic thermal barrier coating 24 in FIGS. 4 and 5 has reduced thickness compared to the ceramic thermal barrier coating 44 in FIG. 2 for operation at the same temperature. Alternatively the same thickness of ceramic thermal barrier coating 24 may be used to allow operation at higher temperatures.

The ceramic thermal barrier coating 24 has alternate layers 25 and 27 which have different structure to create interfaces 26 substantially parallel To the metallic substrate 20/bond coating 22 interface. These interfaces 26 provide paths of increased resistance to heat transfer to emulate the good thermal conductivity properties of thermal sprayed ceramic thermal barrier coatings. The structure in the alternate layers 25, 27 of the ceramic thermal barrier coating 24 is columnar 28 to ensure that the strain tolerance of the ceramic thermal barrier coating 24 is not impaired. The columnar grains 28 in the layers 25, 27 extend substantially perpendicular to the metallic substrate 20/bond coating 22 interface. The difference in structure in layers 25, 27 are the result of variations in the micro-structure and/or density/coarseness of the columnar grains 28 of the ceramic.

It is to be noted that the columnar grains 28 in one of the layers 27 continue to grow into the adjacent layer 25 and that there is no interruption of the columnar grains 28 at the interfaces 26 between the layers 25, 27. It may also be considered that the columnar grains 28 in the ceramic thermal barrier coating 24 extend through the full thickness of the coating 24, and that each columnar grain 28 has its structure modulated along its length by the provision of the layers 25, 27.

The coating system 18 according To the present invention is applied to the metallic substrate 20 by firstly depositing a MCrAlY bond coating 22 onto the metallic substrate 20 by plasma spraying. Alternatively the MCrAlY may be deposited by physical vapour deposition (PVD). A ceramic thermal barrier coating 24 is then deposited onto the MCrAlY bond coating 22.

Figure 7:
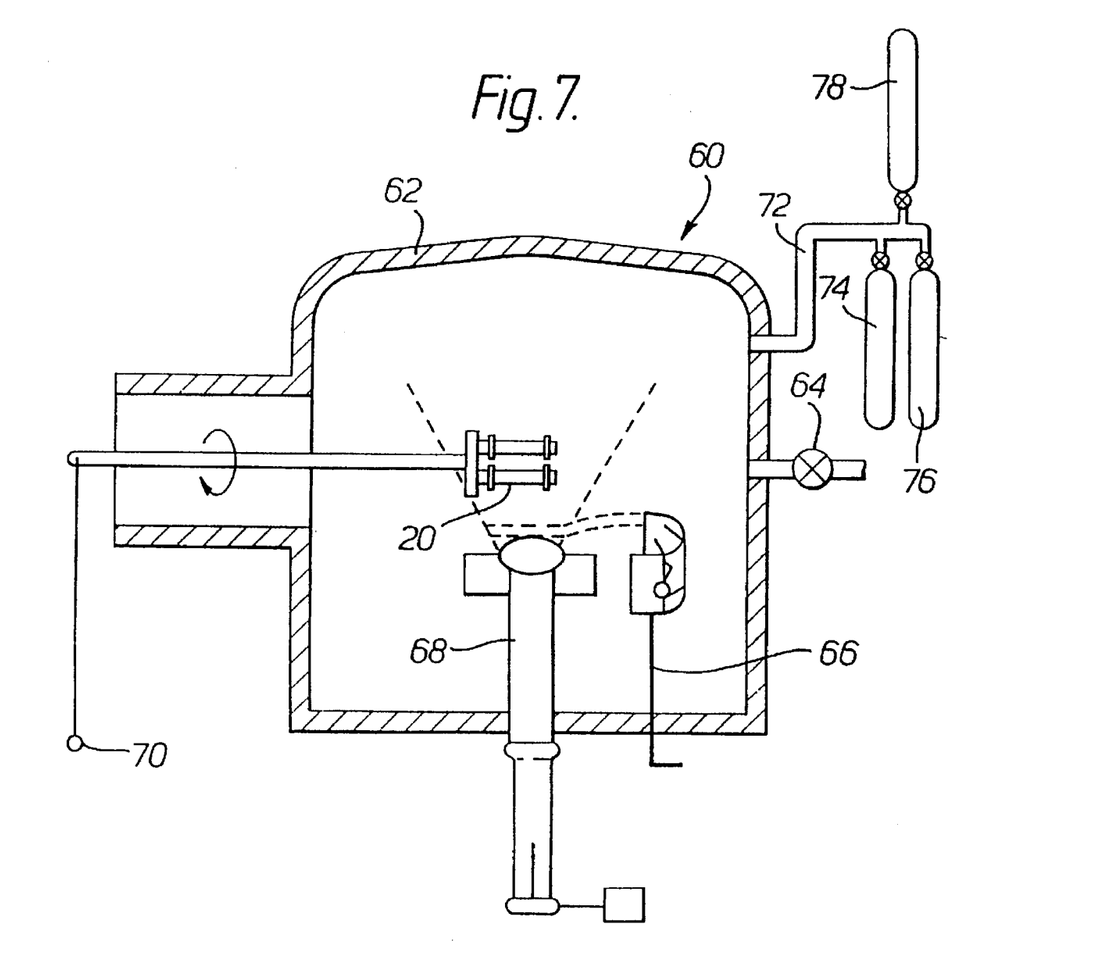
FIG. 7 is a sectional view through an apparatus for use in the method of applying the thermal barrier coating according to the present invention.

An apparatus used for depositing The ceramic thermal barrier coating 24 onto the MCrAlY bond coating 22 is shown in FIG. 7. The apparatus 60 comprises a vacuum chamber 62 which has one or more pumps 64 to evacuate the vacuum chamber 62. An electron beam from an electron beam gun 66 is arranged to impinge upon a supply of ceramic vapour 68, i.e zirconia-yttria alloy, such that the ceramic is evaporated When the vacuum chamber 62 is evacuated. The metallic substrate 20 is also connected into an electrical circuit such that it may given a D.C. or R.F. potential 70. The apparatus 60 also includes supplies of argon 74, hydrogen 76 and oxygen 78 which are interconnected to the interior of the vacuum chamber 62 via a pipe 72. Each of the supplies of argon 74, hydrogen 76 and oxygen 78 are provided with valves to control the flow of the gases.

In order to deposit the ceramic thermal barrier coating 24 onto the MCrAlY bond coating 22 the metallic substrate 20 with the deposited bond coating 22 is placed into the vacuum chamber 62. The vacuum chamber 62 is evacuated and the electron beam gun 66 directs electrons at the supply of ceramic vapour 68 to evaporate ceramic. The interior of the vacuum chamber 62 is supplied with controlled amounts of an inert gas and oxygen during the evaporation of the supply of ceramic vapour 68. The supply of inert gas, e.g. argon, is to maintain the correct glow discharge, or plasma, conditions and the supply of oxygen is to maintain the composition of the ceramic thermal barrier coating at the stoichiometric ratio. The ceramic vapour deposits onto the MCrAlY1Y bond coating 22. In order to produce the layers 25 and 27 in the ceramic thermal barrier coating 24, the ceramic vapour is deposited alternately, for predetermined periods of time, by the physical vapour deposition process (PVD) and by a plasma assisted physical vapour deposition process (PAPVD). In the plasma assisted physical vapour deposition process (PAPVD) a D.C. or R.F. potential is applied to the metallic substrate 20, this is known as ion plating.

The first layer 25 of ceramic deposited onto the bond coating 22 is preferably deposited by plasma assisted physical vapour deposition (PAPVD) such that the ceramic at the interface with the bond coating 22 has a relatively high density and preferably has maximum density.

The use of the plasma assisted physical vapour deposition process (PAPVD) is used to control the structure of the ceramic thermal barrier coating 24 all the way through its thickness, by controlling the way that the columnar ceramic grains 28 grow, to tailor the characteristics of the ceramic at particular positions. The plasma assisted physical vapour deposition process (PAPVD) causes the columnar ceramic grains 28 to be packed together more closely. The D.C. or R.F. potential used during the plasma assisted physical vapour deposition process (PAPVD) may be adjusted for deposition of different ceramic layers to control the density of the columnar ceramic grains 28.

Figure 6:
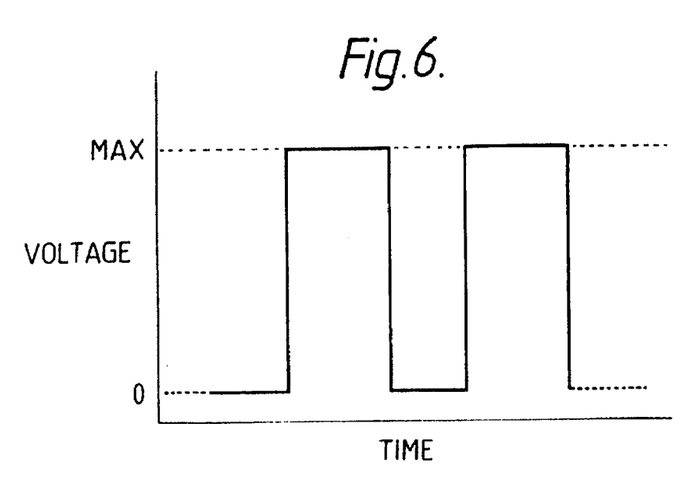
FIG. 6 is a graph of voltage applied to the substrate against time during the application of the thermal barrier coating.

In order to achieve the maximum difference in thermal conductivity between adjacent layers 25, 27, the interfaces 26 between the adjacent layers 25, 27 should be as abrupt as is practical. The abrupt interfaces 26 are preferably achieved by the use of a simple switching action between the physical vapour deposition process and the plasma assisted physical vapour deposition process such that the voltage at the substrate follows a square wave form with time as shown in FIG. 6. The peak voltages in FIG. 6 correspond to the time when the layers 25 of ceramic are deposited by plasma assisted physical vapour deposition and the minimum voltages in FIG. 6 correspond to the time when the layers 27 of ceramic are deposited by physical vapour deposition. The switching points in FIG. 6 correspond to the time when the interfaces 26 between the layers 25 and 27 are produced.

In an experiment four different coating systems were applied to a metallic substrate. The first coating system comprised a plasma sprayed MCrAlY bond coating applied onto a nickel superalloy, N75 a nickel-chromium superalloy, and a purely physical vapour deposited (PVD) ceramic thermal barrier coating applied onto the bond coating. The vacuum chamber was evacuated to a pressure of 5 mTorr and the electron beam gun power was 8 KV at 500 mA. A total coating thickness of $90 \times 10^{-6}$ m was deposited. The thermal conductivity of the ceramic thermal barrier coating was measured at a temperature of 1000° C. and was 1.0 W/m/K.

The second coating system comprised a plasma sprayed MCrAlY bond coating applied onto the same nickel superalloy and a purely plasma assisted physical vapour deposited (PAPVD) ceramic thermal barrier coating applied onto the bond coating. The vacuum chamber was evacuated to a pressure of 7 mTorr and the electron beam gun power was 8 KV at 500 mA. The R.F. power used during the PAPVD process was 500 W. A total ceramic coating thickness of $160 \times 10^{-6}$ m was deposited. The thermal conductivity of the ceramic thermal barrier coating was measured at a temperature of 1000° C. and was 0.55 W/m/K.

The third coating system comprised a plasma sprayed MCrAlY bond coating applied onto the same nickel superalloy and alternate layers of physical vapour deposited (PVD) and plasma assisted physical vapour deposited (PAPVD) ceramic thermal barrier coating applied onto the bond coating. The vacuum chamber was evacuated to a pressure of 4 mTorr and the electron beam gun power was 8 KV at 500 mA. The R.F. power used during the PAPVD process was 500 W. A total of 70 layers of ceramic were deposited. Each of the 35 layers of ceramic deposited by the physical vapour deposition process (PVD) were $2 \times 10^{-6}$ m thick and each of the 35 layers of ceramic deposited by the plasma assisted physical vapour deposition process (PAPVD) were also $2 \times 10^{-6}$ m thick. The thermal conductivity of the ceramic thermal barrier coating was measured at a temperature of 1000° C. and was 0.3 W/m/K.

The fourth coating system comprised a plasma sprayed MCrAlY bond coating applied onto the same nickel superalloy and alternate layers of physical vapour deposited (PVD) and plasma assisted physical vapour deposited (PAPVD) ceramic thermal barrier coating applied onto The bond coating. The vacuum chamber was evacuated to a pressure of 4 mTorr and the electron beam gun power was 8 KV at 500 mA. The R.F. power used during the PAPVD process was 500 W. A total of 70 layers of ceramic were deposited. Each of the 35 layers of ceramic deposited by the physical vapour deposition process (PVD) were $2 \times 10^{-6}$ m thick and each of the 35 layers of ceramic deposited by the plasma assisted physical vapour deposition process (PAPVD) were $1 \times 10^{-6}$ m thick. The thermal conductivity of the ceramic thermal barrier coating was measured at a temperature of 1000° C. and was 1.0 W/m/K.

Figure 8:
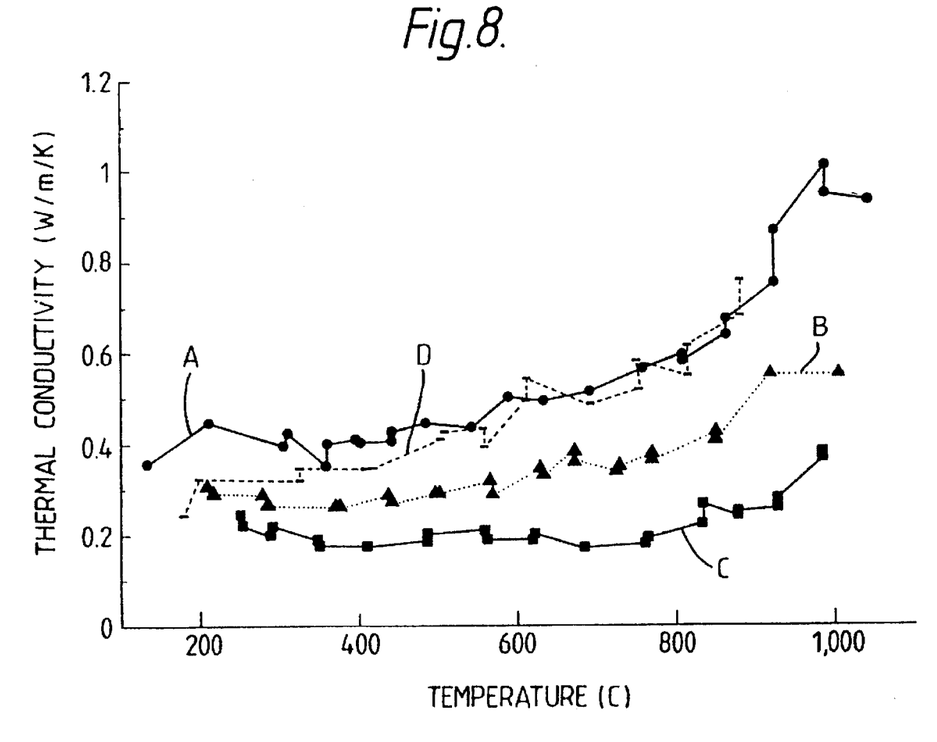
FIG. 8 is a graph of thermal conductivity against temperature for several thermal barrier coatings.

FIG. 8 shows a graph of thermal conductivity against temperature for each of the four different coating systems. Line A indicates the thermal conductivity of the first coating system with temperature. Line B indicates the thermal conductivity of the second Coating system with temperature. Line C indicates the thermal conductivity of the third coating system with temperature and finally line D indicates the thermal conductivity of the fourth coating system with temperature.

The thermal conductivity of the third coating system is a third of that of the first coating system. The first coating system is the ceramic thermal barrier coating applied by the prior art method of physical vapour deposition (PVD). The thermal conductivity of the third coating system is also less than that of the second coating system. The second coating system is the ceramic thermal barrier coating applied purely by plasma assisted physical vapour deposition (PAPVD).

The thermal conductivity of the fourth coating system is approximately the same as the first coating system.

Figure 9:
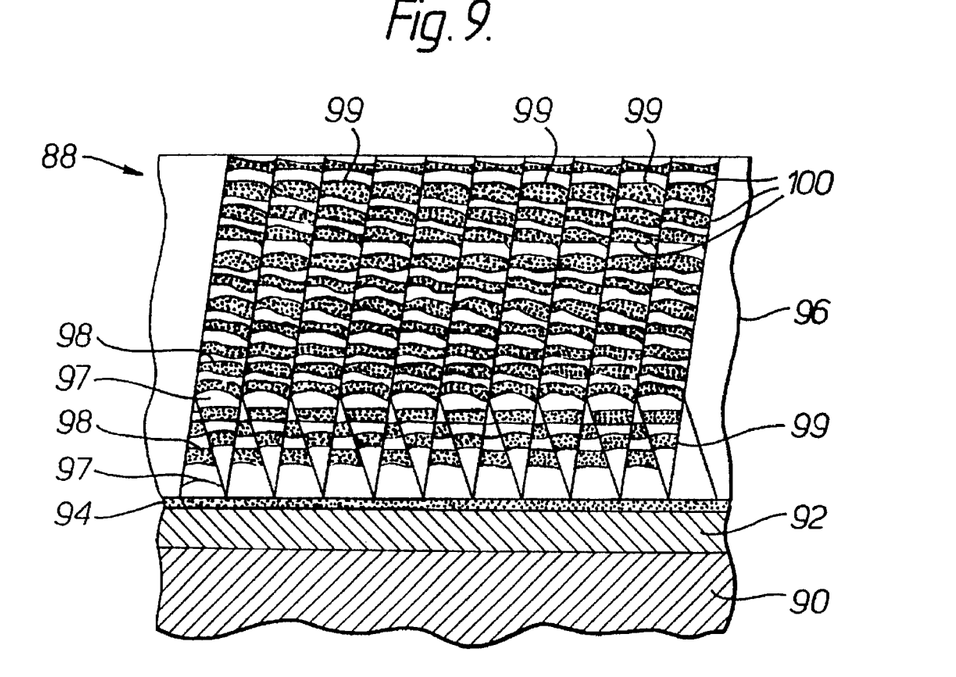
FIG. 9 is a sectional view through an article having an alternative thermal barrier coating applied according to the present invention.
Figure 10:
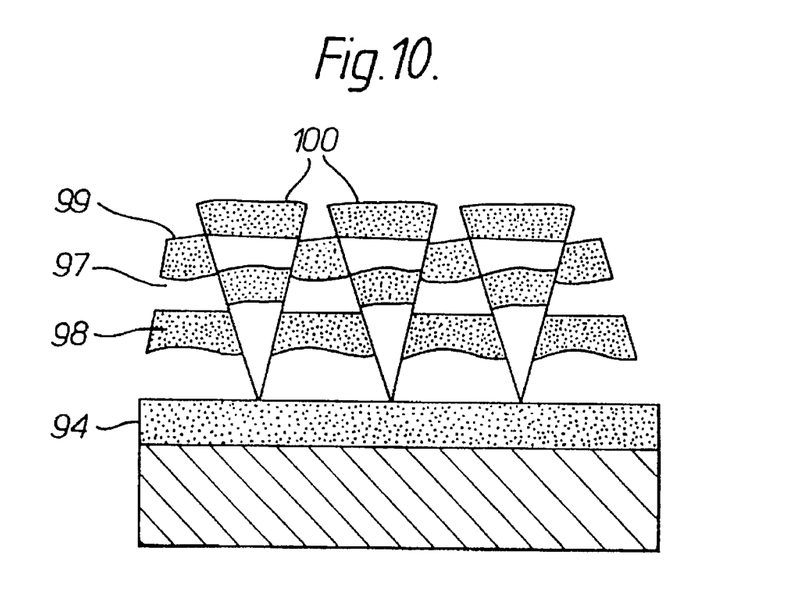
FIG. 10 is an enlarged view of a portion of the thermal barrier coating in FIG. 9.

A further coating system 88 applied by the method of the present invention is shown more clearly in FIGS. 9 and 10. The coating system 88 comprises a bond coating 92, deposited onto the metallic substrate 90, an interface layer 94 on the bond coating 92 and a ceramic thermal barrier coating 96 deposited onto the interface layer 94.

The bond coating 92 is generally a MCrAlY coating which has been deposited by thermal spraying or by physical vapour deposition (PVD). Alternatively the bond coating 92 may be an aluminide coating which has been deposited by pack aluminising or may be a platinum-aluminide coating which has been deposited by platinum aluminising. The bond coating 92 may be a MCrAlY coating with an aluminide top coating or a MCrAlY coating with a platinum aluminide top coating.

The interface layer 94 comprises oxides or oxide/metal on the bond coating which improves the adhesion of the ceramic thermal barrier coating 96. The oxide is predominantly alumina which has controlled structure and properties. The metal comprises the metallic elements in the bond coating.

The ceramic thermal barrier coating 96 is generally zirconia, yttria or a mixture thereof which has been deposited onto the interface layer 94 by physical vapour deposition (PVD). Alternatively the ceramic thermal barrier coating 96 may comprise any other suitable ceramic. The ceramic thermal barrier coating 96 has a columnar grained microstructure 100 which has good strain tolerance, good surface finish and good erosion resistance. The ceramic thermal barrier coating 96 has a relatively low thermal conductivity when compared to the ceramic thermal barrier coating 44 of the coating system 38 in FIG. 2 and is substantially the same or better than the thermal conductivity of the ceramic thermal barrier coating 54 of the coating system 48 in FIG. 3. The ceramic thermal barrier coating 96 in FIGS. 9 and 10 has reduced thickness compared to the ceramic thermal barrier coating 44 in FIG. 2 for operation at the same temperature. Alternatively the same thickness of ceramic thermal barrier coating 96 may be used to allow operation at higher temperatures.

The ceramic thermal barrier coating 96 has alternate layers 97 and 98 which have different structure to create interfaces 99 substantially parallel to the metallic substrate 90/bond coating 92 interface. These interfaces 99 provide paths of increased resistance to heat transfer to emulate the good thermal conductivity properties of thermal sprayed ceramic thermal barrier coatings. The structure in the alternate layers 97, 98 of the ceramic thermal barrier coating 96 is columnar 100 to ensure that the strain tolerance of the ceramic thermal barrier coating 96 is not impaired. The columnar grains 100 in the layers 97,98 extend substantially perpendicular to the metallic substrate 90/bond coating 92 interface. The difference in structure in layers 97, 98 are the result of variations in the structure and/or density/coarseness of the columnar grains 100 of the ceramic.

The columnar grains 100 in one of the layers 98 continue to grow into the adjacent layer 97 and there are no interruptions of the columnar grains 100 at the interfaces 99 between the layers 97, 98. The columnar grains 100 in the ceramic thermal barrier coating 96 extend through the full thickness of the coating 96 and each columnar grain 100 has its structure modulated along its length by the provision of the layers 97, 98.

The coating system 88 according to the present invention is applied to the metallic substrate 90 by firstly depositing a MCrAlY bond coating 92 onto the metallic substrate 90 by plasma spraying. Alternatively the MCrAlY may be deposited by physical vapour deposition (PVD). The surface of the bond coating 92 is then modified to create an oxide or oxide/metal interface layer 94 which has controlled structure and properties to improve the adhesion of the subsequently deposited ceramic thermal barrier coating 96. A ceramic thermal barrier coating 96 is then deposited onto the interface layer 94.

In order to create the interface layer 94 on the surface of the bond coating 92 and to deposit the ceramic thermal barrier coating 96 onto the interface layer 94 the metallic substrate 90 with the deposited bond coating 92 is placed into the vacuum chamber 62.

The vacuum chamber 62 is evacuated and an electrical bias, e.g. a D.C. potential or R.F. field, is applied to the metallic substrate 90 prior to the deposition of the columnar grained ceramic thermal barrier coating 96 in order to modify the structure and/or chemistry of the surface of the bond coating 92. Controlled amounts of gases are introduced into the interior of the vacuum chamber 62 during this phase of the process, for example argon-oxygen, argon-hydrogen or argon. The electrical bias produces chemically active glow discharges or plasmas in the case of argon-oxygen and argon-hydrogen, or produces neutral glow discharges or plasmas in the case of argon. The argon plasma may be used to produce argon ions which bombard the surface of the bond coating 92 to clean the surface i.e. to remove undesired oxides and/or any contaminants. The argon-hydrogen plasma may be used to provide enhanced cleaning of the surface of the bond coating 92 because the additional hydrogen ions chemically react with the undesired contaminants. When the surface of the bond coating 92 is cleaned of undesired oxides and/or contaminants the argon-oxygen plasma, or argon-hydrogen plasma, provides controlled production of desired bonding oxides in an interface 94 on the surface of the bond coating 92. The interface 94 improves the adhesion of the subsequently deposited ceramic thermal barrier coating 96. The gases used during the modification of the surface of the bond coating 92 to produce the interface layer 94 are then extracted from the vacuum chamber 62.

The electron beam gun 66 directs electrons at the supply of ceramic vapour 68 to evaporate ceramic. The interior of the vacuum chamber 62 is supplied with controlled amounts of an inert gas and oxygen during the evaporation of the supply of ceramic vapour 68. The supply of inert gas, e.g. argon, is to maintain the correct glow discharge, or plasma, conditions and the supply of oxygen is to maintain the composition of the ceramic thermal barrier coating at the stoichiometric ratio. The ceramic vapour deposits onto the interface layer 94. In order to produce the layers 97 and 98 in the ceramic thermal barrier coating 96, the ceramic vapour is deposited alternately, for predetermined periods of time, by the physical vapour deposition process (PVD) and by a plasma assisted physical vapour deposition process (PAPVD). In the plasma assisted physical vapour deposition process (PAPVD) a D.C. or R.F. potential is applied To the metallic substrate 90.

The first layer 97 of ceramic deposited onto the interface layer 94 is preferably deposited by plasma assisted physical vapour deposition (PAPVD) such that the ceramic at the interface with the interface layer 94 has a relatively high density and preferably has maximum density.

The use of the plasma assisted physical vapour deposition process (PAPVD) is used to control the structure of the ceramic thermal barrier coating 96 all the way through its thickness, by controlling the way that the columnar ceramic grains 100 grow, to tailor the characteristics of the ceramic at particular positions. The plasma assisted physical vapour deposition process (PAPVD) causes the columnar ceramic grains 100 to be packed together more closely. The D.C. or R.F. potential used during the plasma assisted physical vapour deposition process (PAPVD) may be adjusted for deposition of different ceramic layers to control the density of the columnar ceramic grains 100.

Figure 11:
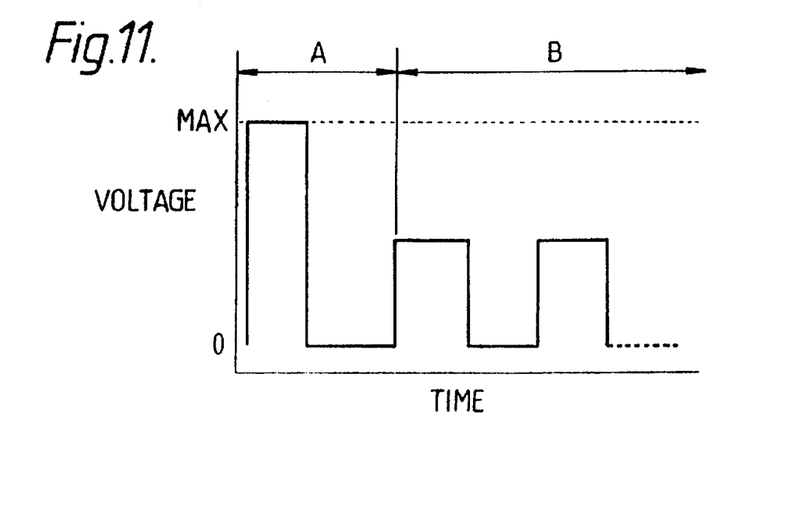
FIG. 11 is a graph of voltage applied to the substrate against time during the application of the thermal barrier coating.

In region A of FIG. 11 an initial large voltage is applied to the metallic substrate 90 to modify the structure and/or chemistry of the surface of the bond coating 92. The magnitude of the initial large voltage is determined by the need to remove contaminants or undesirable oxides from the bond coating 92 prior to establishing the desired oxide structure-composition to achieve satisfactory adhesion of the thermal barrier coating 96. The desired oxide may be grown thermally or in the presence of a glow discharge.

In order to achieve the maximum difference in thermal conductivity between adjacent layers 97, 98 the interfaces 99 between the adjacent layers 97, 98 are kept as abrupt as is practical. The abrupt interfaces 99 are preferably achieved by the use of a simple switching action as shown in region B of FIG. 11 between the physical vapour deposition process such that the voltage at the substrate follows a square wave form with time. The peak voltage in region B of FIG. 11 correspond to the time when the layers 97 of ceramic are deposited by PAPVD and the minimum voltages in region B of FIG. 11 correspond to the time when the layers 98 of ceramic are deposited by PVD. The switching points correspond to the time when the interfaces 99 are produced.

Figure 12:
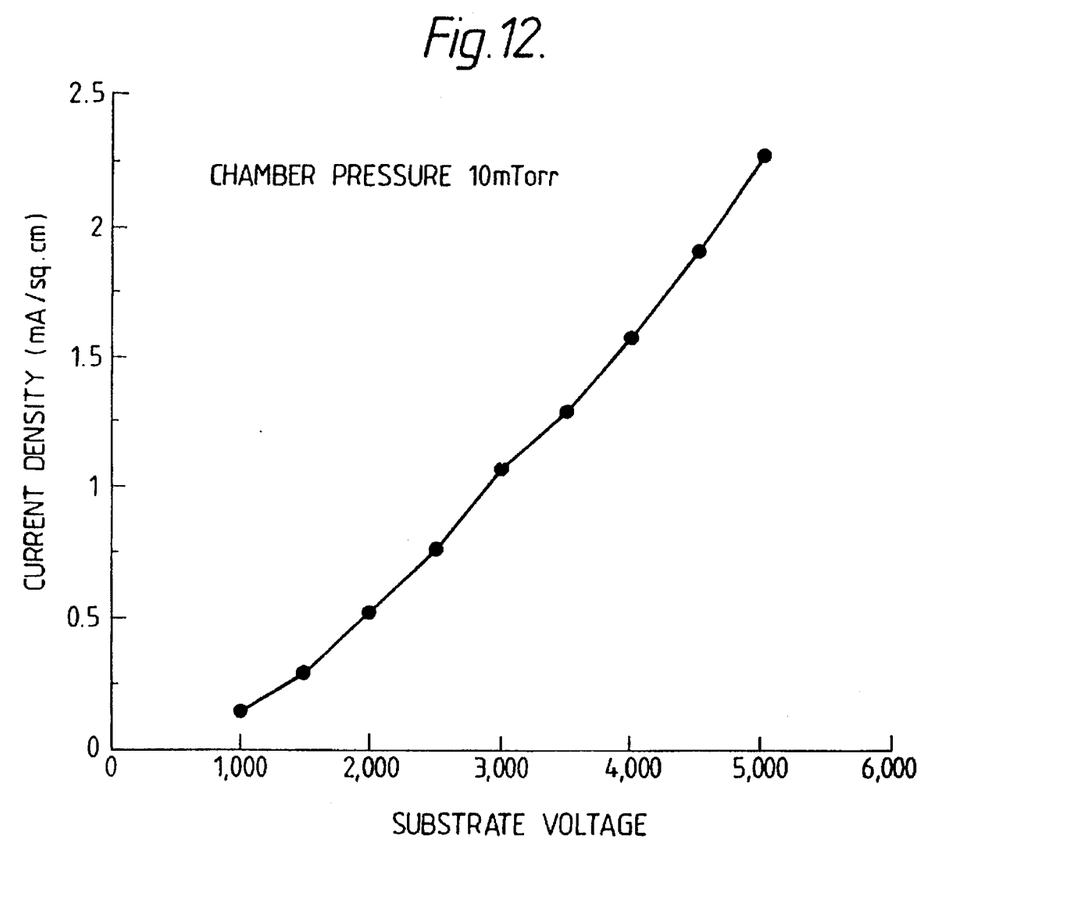
FIG. 12 is a graph of current density against substrate voltage.
Figure 13:
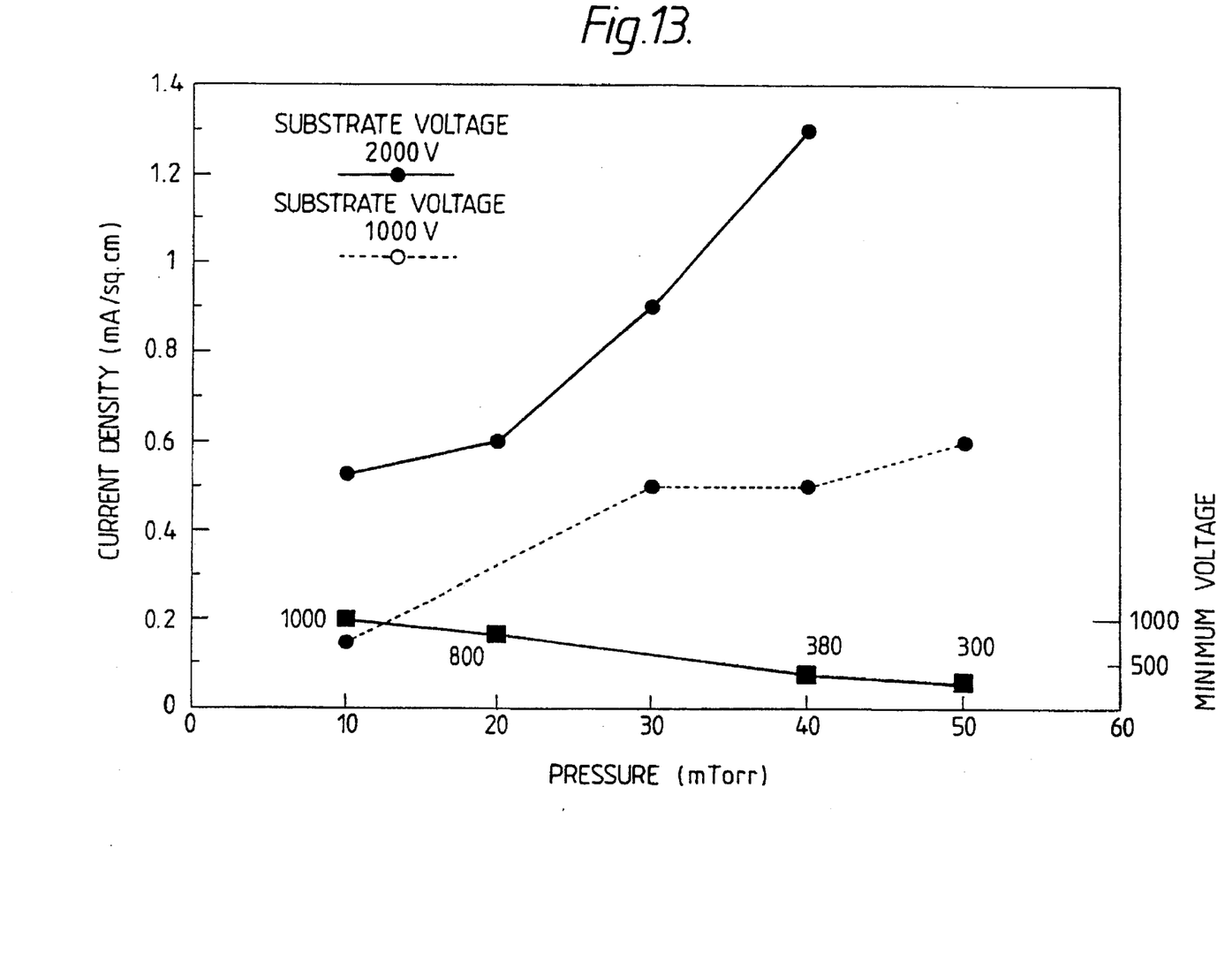
FIG. 13 is a graph of current density against pressure.

The current drawn in the circuit as a function of substrate voltage is shown in FIG. 12, more current is drawn as the voltage increases. In order to sustain a glow discharge for the plasma assisted physical vapour deposition process, in this configuration for electron beam evaporation, the minimum voltages are of the order of three hundred volts as shown in FIG. 13, and the current densities are typically greater than 0.1 mA/sq cm. This increases at any given pressure with applied substrate voltage.

Figure 14:
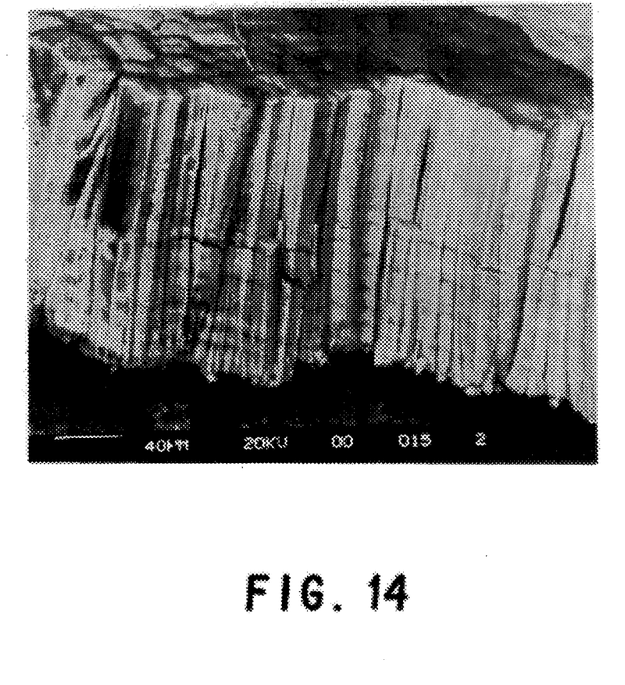
FIG. 14 is a micrograph of a fracture cross-section through an article according to the present invention.

In another experiment the structurally modulated thermal barrier coating was produced by switching between a DC applied substrate bias, having a peak voltage of 2000 volts (negative), and ground. The time interval was 1 minute at each of the voltage levels and the pressure was 10 mtorr. FIG. 14 is a scanning electron micrograph of a fracture cross-section through the thermal barrier coating. The continuous columnar grains can be seen extending through the full thickness of the thermal barrier coating and the modulated structure of the columns is evident. The Outer portion of the coating was deposited purely in the PVD mode.

The voltage applied to the substrate during the plasma assisted physical vapour depositions part of the process is sufficient to cause densification of the thermal barrier coating but is not sufficient to cause renucleation/grain growth within the structure with subsequent loss of the major, through thickness, columnar boundaries.

The physical vapour deposition process described uses electron beam evaporation, however, other physical vapour deposition processes may be used for example sputtering or arc evaporation.

Although the description has referred to physical vapour deposition to deposit the ceramic thermal barrier coating it may be equally possible to deposit the ceramic thermal barrier coating by chemical vapour deposition. The alternate layers may then be deposited using chemical vapour deposition and plasma assisted chemical vapour deposition.

The thermal barrier coatings described in the examples are ceramic materials, however the thermal barrier coating may be any suitable material of low thermal conductivity. Materials suitable for use as thermal barrier coatings are generally oxides, for example zirconia, yttria, hafnia, ceria or combinations of any two or more thereof.

The different layers in the thermal barrier coating are intended to have substantially the same composition, however the process of applying the thermal barrier coating may result in some compositional differences between the different layers.

There appears to be an optimum spacing between the layers of ceramic for improved thermal conductivity when comparing the results of the third and fourth coating systems to the first coating system.

I claim:

1. An article (10) comprising a metallic substrate (20), a bond coating (22) on the metallic substrate (20), a thermal barrier coating (24) on the bond coating (22), the thermal barrier coating (24) comprising a plurality of layers (25, 27), characterised in that each layer (25, 27) has columnar grains (28), the columnar grains (28) in each layer (25, 27) extend substantially perpendicular to an interface between the bond coating (22) and the metallic substrate (20), adjacent layers (25, 27) have different structures to provide at least one interface (26) between adjacent layers (25, 27) which is substantially parallel to the interface between the bond coating (22) and the metallic substrate (20) to increase the resistance to heat transfer through the thermal barrier coating (24).

2. An article as claimed in claim 1 in which the metallic substrate (20) is a superalloy substrate.

3. An article as claimed in claim 2 in which the superalloy substrate (20) is a nickel superalloy substrate.

4. An article as claimed in any one of claims 1 to 3 in which the bond coating (22) comprises a MCrAlY coating, an aluminide coating, a platinum aluminide coating or a combination of a MCrAlY coating and an aluminide coating.

5. An article as claimed in claim 4 in which the bond coating (22) includes an interface layer comprising an oxide or oxide/metal, the thermal barrier (24) coating being on the interface layer.

6. An article as claimed in claim 5 in which the thermal barrier coating (24) is formed from a ceramic material.

7. An article as claimed in claim 6 in which the ceramic material comprises zirconia, yttria or a mixture thereof.

8. An article as claimed in claim 7 in which alternate layers (25) of the thermal barrier coating (24) have substantially the same structure.

9. An article as claimed in claim 8 in which adjacent layers (25, 27) have substantially the same thickness.

10. An article as claimed in claim 9 in which the thickness of each layer (25, 27) is in the range of $0.5 \times 10^{-6}$ m to $10 \times 10^{-6}$ m.

11. An article as claimed in claim 10 in which the thickness of each layer (25, 27) is $2 \times 10^{-6}$ m.

12. An article as claimed in claim 11 in which the total thickness of the thermal barrier coating (24) is equal to or less than $300 \times 10^{-6}$ m.

13. An article as claimed in claim 12 in which the layer adjacent the bond coating (22) has a high density.

14. An article as claimed in claim 13 in which the layer adjacent the bond coating (22) has maximum density.

15. An article as claimed in claim 14 in which the article (10) is a turbine blade or turbine vane.

16. An article as claimed in claim 1, wherein there is one said interface (26) between each of the adjacent layers (25, 27) of the thermal barrier coating (24), and more than one said interface (26) throughout the thermal barrier coating (24).

17. An article (10) comprising a metallic substrate (20), a bond coating (22) on the metallic substrate (20), a thermal barrier coating (24) on the bond coating (22), the thermal barrier coating (24) having columnar grains (28), the columnar grains (28) extending substantially perpendicular to an interface between the bond coating (22) and the metallic substrate (20), characterised in that each of the columnar grains (28) in the thermal barrier coating (24) comprises a plurality of layers (25, 27), adjacent layers (25, 27) have different structures to provide at least one interface (26) between adjacent layers (25, 27) which is substantially parallel to the interface between the bond coating (22) and the metallic substrate (20) to increase the resistance to heat transfer through the thermal barrier coating (24).

18. An article as claimed in claim 17, wherein there is one said interface (26) between each of the adjacent layers (25, 27) of the thermal barrier coating (24), and more than one said interface (26) throughout the thermal barrier coating (24).

19. A method of manufacturing an article (10) comprising applying a bond coating (22) to a metallic substrate (20), applying a thermal barrier coating (24) to the bond coating (22) comprising depositing at least one columnar grained layer (27) by vapour deposition and depositing at least one columnar grained layer (25) by plasma assisted vapour deposition to provide an interface (26) between the adjacent layers (25, 27) which is substantially parallel to the interface between the bond coating (22) and the metallic substrate (20) to increase the resistance to heat transfer through the thermal barrier coating (24).

20. A method as claimed in claim 19 comprising depositing the columnar grained layers (27) by vapour deposition alternately with the columnar grained layers (25) deposited by plasma assisted vapour deposition.

21. A method as claimed in claim 19 or claim 20 comprising depositing the columnar grained layer (25) adjacent to the bond coating (22) by plasma assisted vapour deposition such that it has a high density.

22. A method as claimed in claim 21 comprising depositing the columnar grained layer (25) adjacent to the bond coating (22) such that it has maximum density.

23. A method as claimed in claim 19 comprising applying an electrical bias to the metallic substrate (20) and supplying oxygen to modify the bond coating (22) surface to produce an interface layer comprising oxide or oxide/metal prior to deposition of the columnar grained layers (25, 27) by the vapour deposition processes.

24. A method as claimed in claim 23 comprising applying an electrical gas to the metallic substrate (20) and supplying an inert bias to produce ions to clean the surface of the bond coating (22) prior to the formation of the interface layer.

25. A method as claimed in claim 19 comprising depositing the columnar grained layers (27) deposited by vapour deposition and the columnar grained layers (25) deposited by plasma assisted vapour deposition such that they have substantially the same thickness.

26. A method as claimed in claim 19 in which the vapour deposition process is physical vapour deposition.

27. A method as claimed in claim 26 in which the physical vapour deposition process is electron beam evaporation, sputtering or arc evaporation.

28. A method as claimed in claim 27 comprising depositing the columnar grained layers (25, 27) to a thickness in the range of $0.5 \times 10^{-6}$ m to $10 \times 10^{-6}$ m.

29. A method as claimed in claim 28 comprising depositing the columnar grained layers (25, 27) to a total thickness equal to or less than $300 \times 10^{-6}$ m.

30. A method as claimed in claim 28 in which the thickness of the columnar grained layers (25, 27) is $2 \times 10^{-6}$ m.

31. A method as claimed in claim 16 to comprising applying the bond coating (22) by thermal spraying.

32. A method as claimed in claim 31 in which the bond coating (22) comprises a MCrAlY coating, an aluminide coating, a platinum aluminide coating or a combination of a MCrAlYIY coating and an aluminide coating.

33. A method as claimed in claim 32 in which that the metallic substrate (20) is a superalloy substrate.

34. A method as claimed in claim 33 in which that the thermal barrier coating (24) comprises a ceramic material.

35. A method as claimed in claim 34 in which the ceramic material is zirconia, yttria or a mixture thereof.

36. A method as claimed in claim 19, wherein one said interface (26) is provided between each of the adjacent layers (25, 27) of the thermal barrier coating (24), and more than one said interface (26) is provided throughout the thermal barrier coating (24).

37. A method of manufacturing an article (10) comprising applying a bond coating (22) to a metallic substrate (20), applying a thermal barrier coating (24) to the bond coating (22) characterised by applying a first voltage to the metallic substrate (20) and depositing at least one columnar grained layer (27) by vapour deposition, substantially instantaneously applying a second different voltage to the metallic substrate (20) and depositing at least one columnar grained layer (25) by vapour deposition to provide an interface (26) between the adjacent layers (25, 27) which is substantially parallel to the interface between the bond coating (22) and the metallic substrate (20) to increase the resistance to heat transfer through the thermal barrier coating (24).

38. A method as claimed in claim 37, wherein one said interface (26) is provided between each of the adjacent layers (25, 27) of the thermal barrier coating (24), and more than one said interface (26) is provided throughout the thermal barrier coating (24).

39. A method of manufacturing an article comprising applying a bond coating to a metallic substrate, applying a thermal barrier coating to the bond coating characterised by depositing at least one columnar grained layer by vapour deposition without any voltage, substantially instantaneously applying a voltage to the metallic substrate and depositing at least one columnar grained layer by vapour deposition to provide an interface between the adjacent layers which is substantially parallel to the interface between the bond coating and the metallic substrate to increase the resistance to heat transfer through the thermal barrier coating.

40. A method as claimed in claim 39, wherein one said adjacent layer interface is provided between each of the adjacent columnar grained layers of the thermal barrier coating, and more than one said adjacent layer interface is provided throughout the thermal barrier coating.

* * * * *